(12) United States Patent
Yamaguchi

(10) Patent No.: US 8,884,153 B2
(45) Date of Patent: Nov. 11, 2014

(54) PHOTOELECTRIC CONVERSION ELEMENT AND INTERCONNECTOR-EQUIPPED PHOTOELECTRIC CONVERSION ELEMENT

(75) Inventor: Hiroshi Yamaguchi, Yamatotakada (JP)

(73) Assignee: Sharp Kabushiki Kaisha, Osaka (JP)

( * ) Notice: Subject to any disclaimer, the term of this patent is extended or adjusted under 35 U.S.C. 154(b) by 1524 days.

(21) Appl. No.: 11/808,123

(22) Filed: Jun. 6, 2007

(65) Prior Publication Data

US 2008/0041437 A1    Feb. 21, 2008

(30) Foreign Application Priority Data

Jun. 23, 2006 (JP) ................ 2006-173746
Mar. 30, 2007 (JP) ................ 2007-093314

(51) Int. Cl.
*H01L 31/042* (2014.01)
*H01L 31/00* (2006.01)
*H01L 31/05* (2014.01)

(52) U.S. Cl.
CPC *H01L 31/05* (2013.01); *Y02E 10/50* (2013.01)
USPC .......................................... 136/244; 136/255

(58) Field of Classification Search
USPC .................................. 136/244, 255
See application file for complete search history.

(56) References Cited

U.S. PATENT DOCUMENTS

| | | | |
|---|---|---|---|
| 3,502,507 A | 3/1970 | Mann | |
| 4,179,322 A * | 12/1979 | Brown et al. | 156/192 |
| 4,451,691 A | 5/1984 | Fraas | |
| 4,617,420 A | 10/1986 | Dilts et al. | |
| 4,638,109 A | 1/1987 | Ishihara et al. | |
| 4,638,111 A | 1/1987 | Gay | |
| 4,810,661 A * | 3/1989 | Yamazaki | 438/73 |
| 5,006,179 A * | 4/1991 | Gaddy | 136/244 |
| 5,023,144 A * | 6/1991 | Yamamoto et al. | 428/606 |
| 5,131,956 A | 7/1992 | Oohara et al. | |
| 5,322,572 A | 6/1994 | Wanlass | |
| 5,430,616 A | 7/1995 | Katsu et al. | |
| 5,510,272 A | 4/1996 | Morikawa et al. | |
| 5,538,902 A | 7/1996 | Izu et al. | |

(Continued)

FOREIGN PATENT DOCUMENTS

| | | |
|---|---|---|
| EP | 1 909 333 A1 | 4/2008 |
| JP | 56-108282 A | 8/1981 |

(Continued)

OTHER PUBLICATIONS

Nakamura, JP 2002-289634 A, machine English translation.*

(Continued)

*Primary Examiner* — Tamir Ayad
(74) *Attorney, Agent, or Firm* — Nixon & Vanderhye, P.C.

(57) ABSTRACT

Provided are a photoelectric conversion element and an interconnector-equipped photoelectric conversion element, the photoelectric conversion element including: a photoelectric conversion layer having at least one pn junction; a first electrode pad provided on a surface of the photoelectric conversion layer; a second electrode pad provided on a surface different from the surface of the photoelectric conversion layer on which the first electrode pad is provided; and a third electrode provided on a surface of the photoelectric conversion layer opposite to the surface on which the second electrode pad is provided, wherein at least one of surface shapes of the first electrode pad and the second electrode pad is a polygon in which any internal angle is an obtuse angle or a shape having no corner.

11 Claims, 13 Drawing Sheets

(56) References Cited

U.S. PATENT DOCUMENTS

| | | |
|---|---|---|
| 5,538,903 A | 7/1996 | Aramoto et al. |
| 6,278,054 B1 | 8/2001 | Ho et al. |
| 6,359,210 B2 | 3/2002 | Ho et al. |
| 6,563,289 B1 * | 5/2003 | Cross ............................ 320/101 |
| 2002/0005583 A1 * | 1/2002 | Harada et al. ................. 257/758 |
| 2002/0179141 A1 | 12/2002 | Ho et al. |
| 2003/0025115 A1 * | 2/2003 | Uemura et al. ................. 257/40 |
| 2004/0040593 A1 | 3/2004 | Ho et al. |
| 2004/0166681 A1 | 8/2004 | Iles et al. |
| 2004/0206389 A1 | 10/2004 | Takamoto et al. |
| 2005/0183765 A1 | 8/2005 | Ho et al. |
| 2005/0263178 A1 * | 12/2005 | Montello et al. ............. 136/244 |
| 2006/0180198 A1 | 8/2006 | Takamoto et al. |

FOREIGN PATENT DOCUMENTS

| | | | |
|---|---|---|---|
| JP | 60-240171 | 11/1985 | |
| JP | 3-263880 | 11/1991 | |
| JP | 3-283474 | 12/1991 | |
| JP | 5-114747 | 5/1993 | |
| JP | 06-196744 | 7/1994 | |
| JP | 10-270726 A | 10/1998 | |
| JP | 2000-312017 A | 11/2000 | |
| JP | 2001-94128 A | 4/2001 | |
| JP | 2002-517098 | 6/2002 | |
| JP | 2002289634 A * | 10/2002 | ............. H01L 21/60 |
| JP | 2004-327889 | 11/2004 | |
| JP | 2005-039252 | 2/2005 | |
| JP | 2006-228900 | 8/2006 | |
| WO | 2007/013625 A1 | 2/2007 | |

OTHER PUBLICATIONS

Hamakawa et al., *Solar Energy Technology—Solar Cell*, Kabushiki Kaisha Baifukan, Sep. 20, 1998, pp. 178-179, and partial English translation, total of 4 pages.

U.S. Office Action mailed May 12, 2009 in related U.S. Appl. No. 11/351,253.

Tatsuya Takamoto et al., U.S. Appl. No. 11/351,253 Office Action mailed May 14, 2010 (12 pages).

\* cited by examiner

PHOTOELECTRIC CONVERSION ELEMENT AND INTERCONNECTOR-EQUIPPED PHOTOELECTRIC CONVERSION ELEMENT

This nonprovisional application is based on Japanese Patent Applications Nos. 2006-173746 and 2007-093314 filed with the Japan Patent Office on Jun. 23, 2006 and Mar. 30, 2007, respectively, the entire contents of which are hereby incorporated by reference.

BACKGROUND OF THE INVENTION

1. Field of the Invention

The present invention relates to a photoelectric conversion element and an interconnector-equipped photoelectric conversion element. In particular, the present invention relates to a photoelectric conversion element and an interconnector-equipped photoelectric conversion element capable of reducing occurrence of cracks in a photoelectric conversion layer.

2. Description of the Background Art

FIG. 12 shows a schematic cross sectional view of an exemplary conventional interconnector-equipped photoelectric conversion element. As shown in FIG. 12, the conventional interconnector-equipped photoelectric conversion element includes a photoelectric conversion layer 1 with a thickness of not more than 50 μm including a semiconductor substrate and a plurality of semiconductor layers formed of epitaxially grown monocrystalline thin films and having at least one pn junction, a first electrode pad 8 provided on a surface of photoelectric conversion layer 1, a second electrode pad 4 provided on a surface different from the surface of photoelectric conversion layer 1 on which the first electrode pad 8 is provided, and a third electrode 3 formed of a metal thin film and provided on a surface of a p-type semiconductor layer opposite to the surface on which the second electrode pad 4 is provided. It is further equipped with an interconnector 5. A protective film 7 made of a flexible resin is affixed to both surfaces of photoelectric conversion layer 1 with a transparent adhesive 6 for protection from an ambient environment. Since the conventional interconnector-equipped photoelectric conversion element as described above includes photoelectric conversion layer 1 with a very thin thickness of not more than 50 μm, it has a characteristic of being highly flexible.

As shown in FIG. 13 illustrating a schematic plan view, interconnector 5 is connected to each of a surface of the first electrode pad 8 and a surface of the second electrode pad 4. Surface shapes of the first electrode pad 8 and the second electrode pad 4 and a surface shape of a leading end portion of interconnector 5 each have a corner of 90° to minimize loss of a light receiving area and to maximize a contact area between interconnector 5 and each of the electrode pads described above (see for example Patent Document 1 (Japanese Patent Laying-Open No. 06-196744)).

SUMMARY OF THE INVENTION

Although the conventional photoelectric conversion element including a photoelectric conversion layer with a very thin thickness of not more than 50 μm has a characteristic that it is highly flexible and not cracked easily, it has been found that, when the photoelectric conversion element is bent, a crack is caused in the photoelectric conversion layer by an electrode pad and an interconnector provided to connect the photoelectric conversion elements in series or in parallel.

This seems to be because, while sufficient flexibility is obtained in a portion of the photoelectric conversion layer having an even surface, the photoelectric conversion layer is damaged by the interconnector or the electrode pad in a portion having an uneven surface, such as an interconnector portion and an electrode pad portion.

In view of the above circumstances, one object of the present invention is to provide a photoelectric conversion element and an interconnector-equipped photoelectric conversion element capable of reducing occurrence of cracks in a photoelectric conversion layer.

According to a first non-limitinmode of the present invention, a photoelectric conversion element can be provided, including: a photoelectric conversion layer having at least one pn junction; a first electrode pad provided on a surface of the photoelectric conversion layer; a second electrode pad provided on a surface different from the surface of the photoelectric conversion layer on which the first electrode pad is provided; and a third electrode provided on a surface of the photoelectric conversion layer opposite to the surface on which the second electrode pad is provided, wherein at least one of surface shapes of the first electrode pad and the second electrode pad is a polygon in which any internal angle is an obtuse angle.

Preferably, in the photoelectric conversion element according to the first mode of the present invention, the obtuse angle is not less than 120°.

According to a second non-limiting mode of the present invention, a photoelectric conversion element can be provided, including: a photoelectric conversion layer having at least one pn junction; a first electrode pad provided on a surface of the photoelectric conversion layer; a second electrode pad provided on a surface different from the surface of the photoelectric conversion layer on which the first electrode pad is provided; and a third electrode provided on a surface of the photoelectric conversion layer opposite to the surface on which the second electrode pad is provided, wherein at least one of surface shapes of the first electrode pad and the second electrode pad is a shape having no corner.

Preferably, in the photoelectric conversion element according to the first and second modes of the present invention, the photoelectric conversion layer has a thickness of not more than 50 μm.

According to a third non-limiting mode of the present invention, an interconnector-equipped photoelectric conversion element can be provided, including: a photoelectric conversion element including a photoelectric conversion layer having at least one pn junction, a first electrode pad provided on a surface of the photoelectric conversion layer, a second electrode pad provided on a surface different from the surface of the photoelectric conversion layer on which the first electrode pad is provided, and a third electrode provided on a surface of the photoelectric conversion layer opposite to the surface on which the second electrode pad is provided; and an interconnector connected to at least one of the first electrode pad and the second electrode pad of the photoelectric conversion element, wherein a leading end portion of the interconnector adjacent to the electrode pad has a surface shape in which any corner has an obtuse angle.

Preferably, in the interconnector-equipped photoelectric conversion element according to the third mode of the present invention, the obtuse angle is not less than 120°.

According to a fourth non-limiting mode of the present invention, an interconnector-equipped photoelectric conversion element can be provided, including: a photoelectric conversion element including a photoelectric conversion layer having at least one pn junction, a first electrode pad provided on a surface of the photoelectric conversion layer, a second electrode pad provided on a surface different from the surface of the photoelectric conversion layer on which the first electrode pad is provided, and a third electrode provided on a surface of the photoelectric conversion layer opposite to the surface on which the second electrode pad is provided; and an interconnector connected to at least one of the first electrode pad and the second electrode pad of the photoelectric conversion element, wherein a surface shape of a leading end portion of the interconnector adjacent to the electrode pad is a shape having no corner.

According to a fifth non-limiting mode of the present invention, an interconnector-equipped photoelectric conversion element can be provided, including any of the photoelectric conversion elements described above and an interconnector connected to at least one of the first electrode pad and the second electrode pad of the photoelectric conversion element, wherein a surface shape of a leading end portion of the interconnector adjacent to the electrode pad is a shape in which any corner has an obtuse angle or a shape having no corner.

Preferably, in the interconnector-equipped photoelectric conversion element according to the fifth mode of the present invention, the obtuse angle of the polygon that is at least one of the surface shapes of the first electrode pad and the second electrode pad of the photoelectric conversion element, and/or the obtuse angle of the surface shape of the leading end portion of the interconnector adjacent to the electrode pad is not less than 120°.

Preferably, in the interconnector-equipped photoelectric conversion element according to the third to fifth modes of the present invention, the photoelectric conversion layer of the photoelectric conversion element described above has a thickness of not more than 50 µm.

According to one or more aspects of the present invention, a photoelectric conversion element and an interconnector-equipped photoelectric conversion element capable of reducing occurrence of cracks in a photoelectric conversion layer can be provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
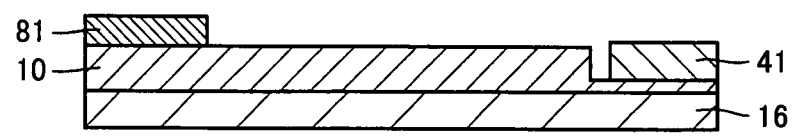
FIG. 1 is a schematic cross sectional view of a preferable exemplary photoelectric conversion element of the present invention.

Hereinafter, embodiments of the present invention will be described. In the drawings of the present invention, identical or corresponding parts will be designated by the same reference numerals.

FIG. 1 shows a schematic cross sectional view of a preferable exemplary photoelectric conversion element of the present invention. The photoelectric conversion element of the present invention includes a photoelectric conversion layer 10 having at least one pn junction, a first electrode pad 81 provided on a surface of photoelectric conversion layer 10, a second electrode pad 41 provided on a surface different from the surface of photoelectric conversion layer 10 on which the first electrode pad 81 is provided, and a third electrode 16 provided on a surface of photoelectric conversion layer 10 opposite to the surface on which the second electrode pad 41 is provided.

Figure 2:
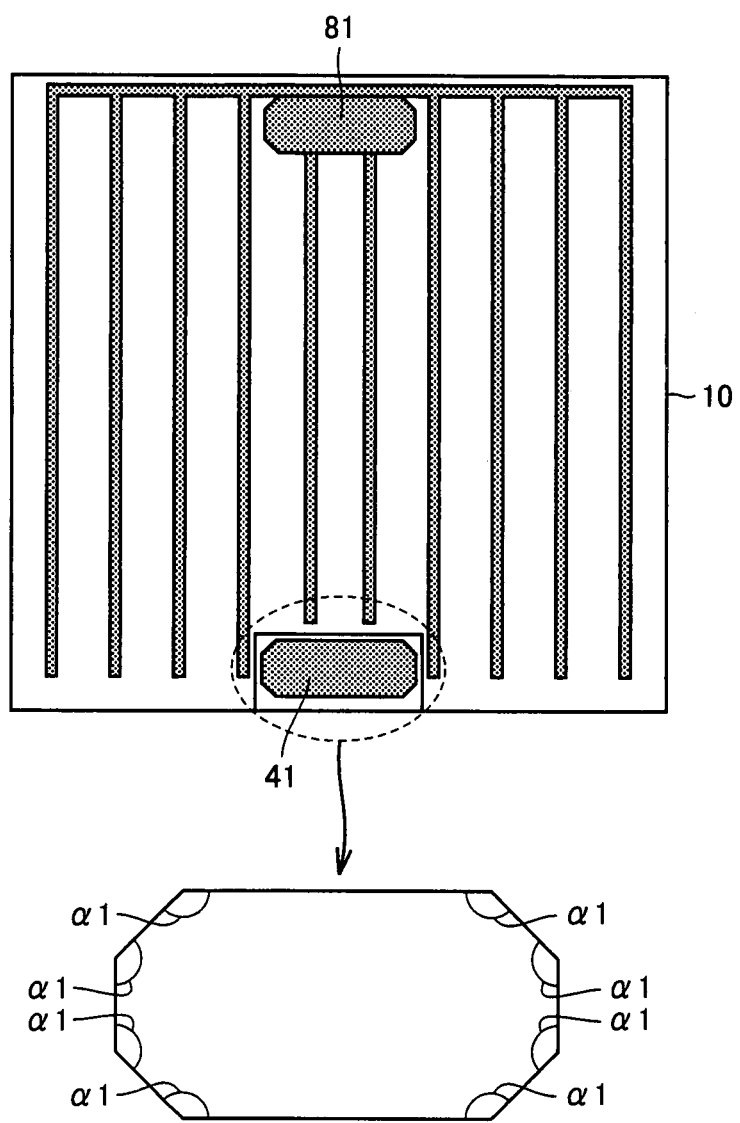
FIG. 2 is a schematic plan view of the photoelectric conversion element of the present invention shown in FIG. 1 when seen from above.
Figure 13:
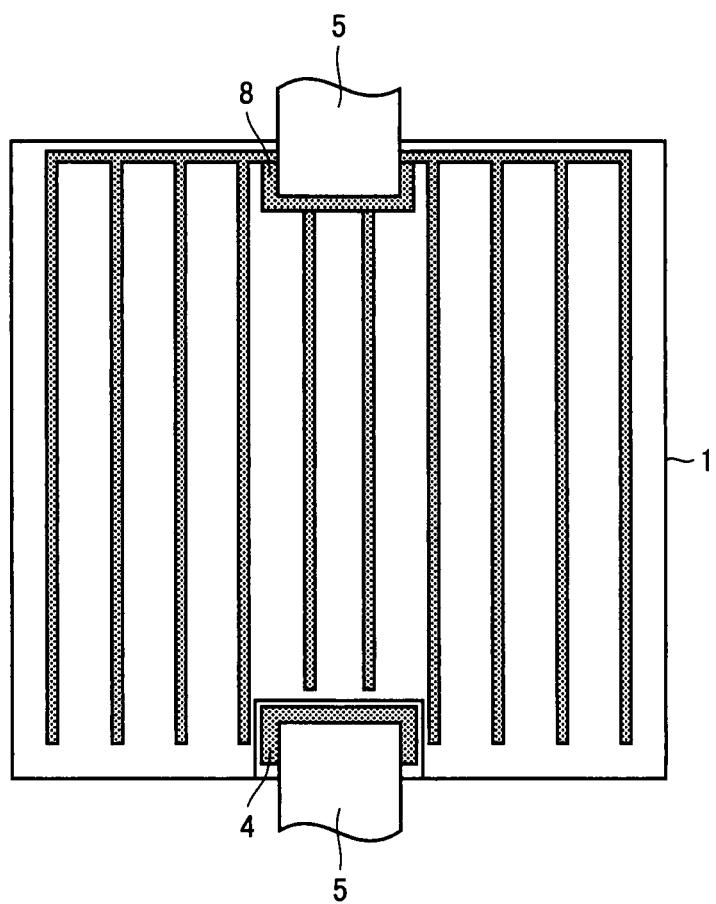
FIG. 13 is a schematic plan view of the conventional interconnector-equipped photoelectric conversion element shown in FIG. 12 when seen from above.

FIG. 2 shows a schematic plan view of the photoelectric conversion element of the present invention shown in FIG. 1 when seen from above. The photoelectric conversion element of the present invention has a characteristic that surface shapes of the first electrode pad 81 and of the second electrode pad 41 are both polygons in which any internal angle α1 is an obtuse angle. In this manner, by forming both the surface shape of the first electrode pad 81 and the surface shape of the second electrode pad 41 as polygons in which any internal angle α1 is an obtuse angle, concentration of stress on the photoelectric conversion layer applied by a corner of the first electrode pad 81 and a corner of the second electrode pad 41 when the photoelectric conversion element is bent can be alleviated compared to the conventional case shown in FIG. 13 using the first electrode pad 8 and the second electrode pad 4 having a corner of 90°. Accordingly, in the photoelectric conversion element of the present invention, damage to the photoelectric conversion layer caused by the corner of the first electrode pad 81 and the corner of the second electrode pad 41 can be reduced, and thus occurrence of cracks in the photoelectric conversion layer can be reduced.

Although the above description has been given on the case where both the surface shape of the first electrode pad 81 and the surface shape of the second electrode pad 41 are octagons, the polygon in which any internal angle is an obtuse angle is not limited to an octagon in the present invention.

Further, in the above description, when the surface shape of the first electrode pad 81 and/or the surface shape of the second electrode pad 41 are/is polygon(s) in which any internal angle is an obtuse angle, it is preferable that the internal angle is not less than 120°. In this case, there is a tendency that occurrence of cracks in the photoelectric conversion layer can further be reduced.

Furthermore, although the above description has been given on the case where both the surface shape of the first electrode pad 81 and the surface shape of the second electrode pad 41 are octagons in which any internal angle α1 is an obtuse angle, it is satisfactory in the present invention if either the surface shape of the first electrode pad 81 or the surface shape of the second electrode pad 41 is a polygon in which any internal angle is an obtuse angle. From the viewpoint of reducing occurrence of cracks in the photoelectric conversion layer more effectively, however, it is preferable that both the surface shape of the first electrode pad 81 and the surface shape of the second electrode pad 41 are polygons in which any internal angle is an obtuse angle.

Figure 3:
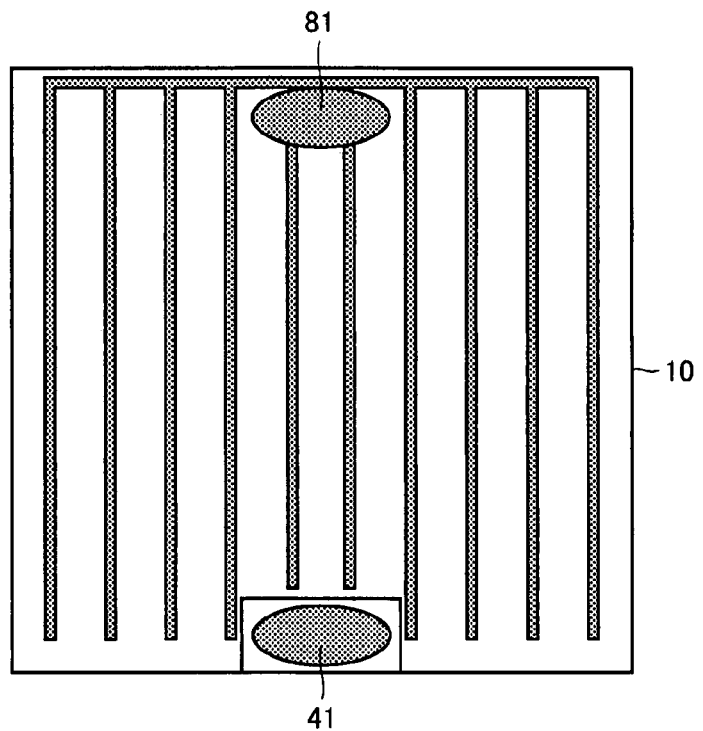
FIG. 3 is a schematic plan view of another preferable exemplary photoelectric conversion element of the present invention when seen from above.

FIG. 3 shows a schematic plan view of another preferable exemplary photoelectric conversion element of the present invention when seen from above. The photoelectric conversion element of the present invention has a characteristic that both the surface shape of the first electrode pad 81 and the surface shape of the second electrode pad 41 are ellipses. In this manner, by forming each of the surface shape of the first electrode pad 81 and the surface shape of the second electrode pad 41 as a shape having no corner such as an ellipse, concentration of stress on the photoelectric conversion layer that would be applied by a corner of the first electrode pad 81 and a corner of the second electrode pad 41 when the photoelectric conversion element is bent can be alleviated compared to the conventional case shown in FIG. 13 using the first electrode pad 8 and the second electrode pad 4 having a corner of 90°. Accordingly, in the photoelectric conversion element of the present invention, damage to the photoelectric conversion layer that would be caused by the corner of the first electrode pad 81 and the corner of the second electrode pad 41 can be reduced, and thus occurrence of cracks in the photoelectric conversion layer can be reduced.

Figure 4:
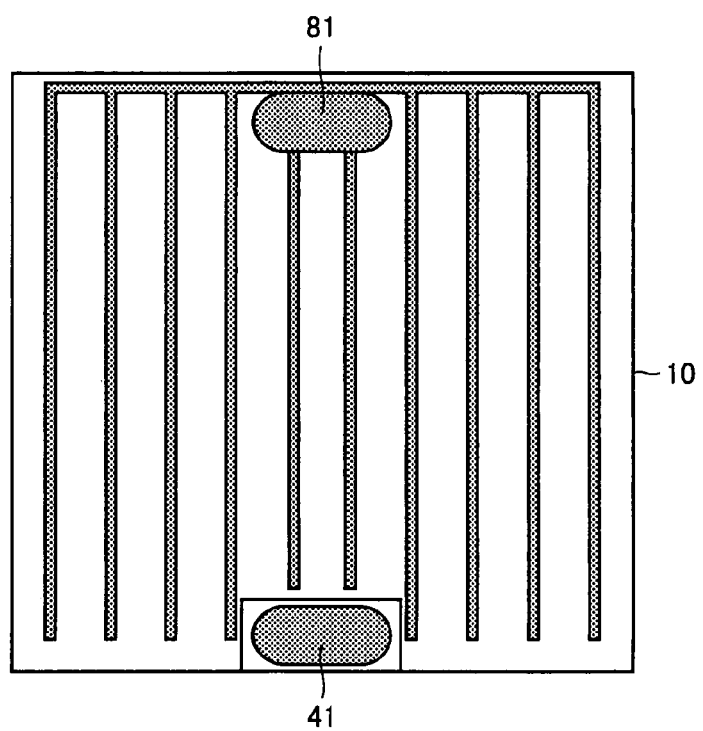
FIG. 4 is a schematic plan view of still another preferable exemplary photoelectric conversion element of the present invention when seen from above.

FIG. 4 shows a schematic plan view of still another preferable exemplary photoelectric conversion element of the present invention when seen from above. The photoelectric conversion element of the present invention has a characteristic that both the surface shape of the first electrode pad 81 and the surface shape of the second electrode pad 41 are like tracks having no corner. In this manner, by forming each of the surface shape of the first electrode pad 81 and the surface shape of the second electrode pad 41 as a shape having no corner such as a track having no corner, concentration of stress on the photoelectric conversion layer that would be applied by a corner of the first electrode pad 81 and a corner of the second electrode pad 41 when the photoelectric conversion element is bent can be alleviated compared to the conventional case shown in FIG. 13 using the first electrode pad 8 and the second electrode pad 4 having a corner of 90°. Accordingly, in the photoelectric conversion element of the present invention, damage to the photoelectric conversion layer that would be caused by the corner of the first electrode pad 81 and the corner of the second electrode pad 41 can be reduced, and thus occurrence of cracks in the photoelectric conversion layer can be reduced.

Although the above description has been given on the case where the surface shape of the first electrode pad 81 and the surface shape of the second electrode pad 41 are ellipses and tracks having no corner as exemplary shapes having no corner, the shapes having no corner in the present invention are not limited to these, and may be other shapes.

Further, although the above description has been given on the case where both the surface shape of the first electrode pad 81 and the surface shape of the second electrode pad 41 are a shape having no corner, it is satisfactory in the present invention if either the surface shape of the first electrode pad 81 or the surface shape of the second electrode pad 41 is a shape having no corner. From the viewpoint of reducing occurrence of cracks in the photoelectric conversion layer more effectively, however, it is preferable that both the surface shape of the first electrode pad 81 and the surface shape of the second electrode pad 41 are a shape having no corner.

Figure 5:
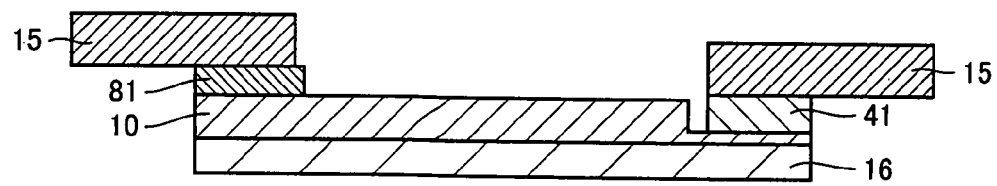
FIG. 5 is a schematic cross sectional view of a preferable exemplary interconnector-equipped photoelectric conversion element of the present invention.

FIG. 5 shows a schematic cross sectional view of a preferable exemplary interconnector-equipped photoelectric conversion element of the present invention. The interconnector-equipped photoelectric conversion element of the present invention includes: a photoelectric conversion element including photoelectric conversion layer 10 having at least one pn junction, the first electrode pad 81 provided on a surface of photoelectric conversion layer 10, the second electrode pad 41 provided on a surface different from the surface of photoelectric conversion layer 10 on which the first electrode pad 81 is provided, and the third electrode 16 provided on a surface of photoelectric conversion layer 10 opposite to the surface on which the second electrode pad 41 is provided; and an interconnector 15 connected to each of the first electrode pad 81 and the second electrode pad 41.

Figure 6:
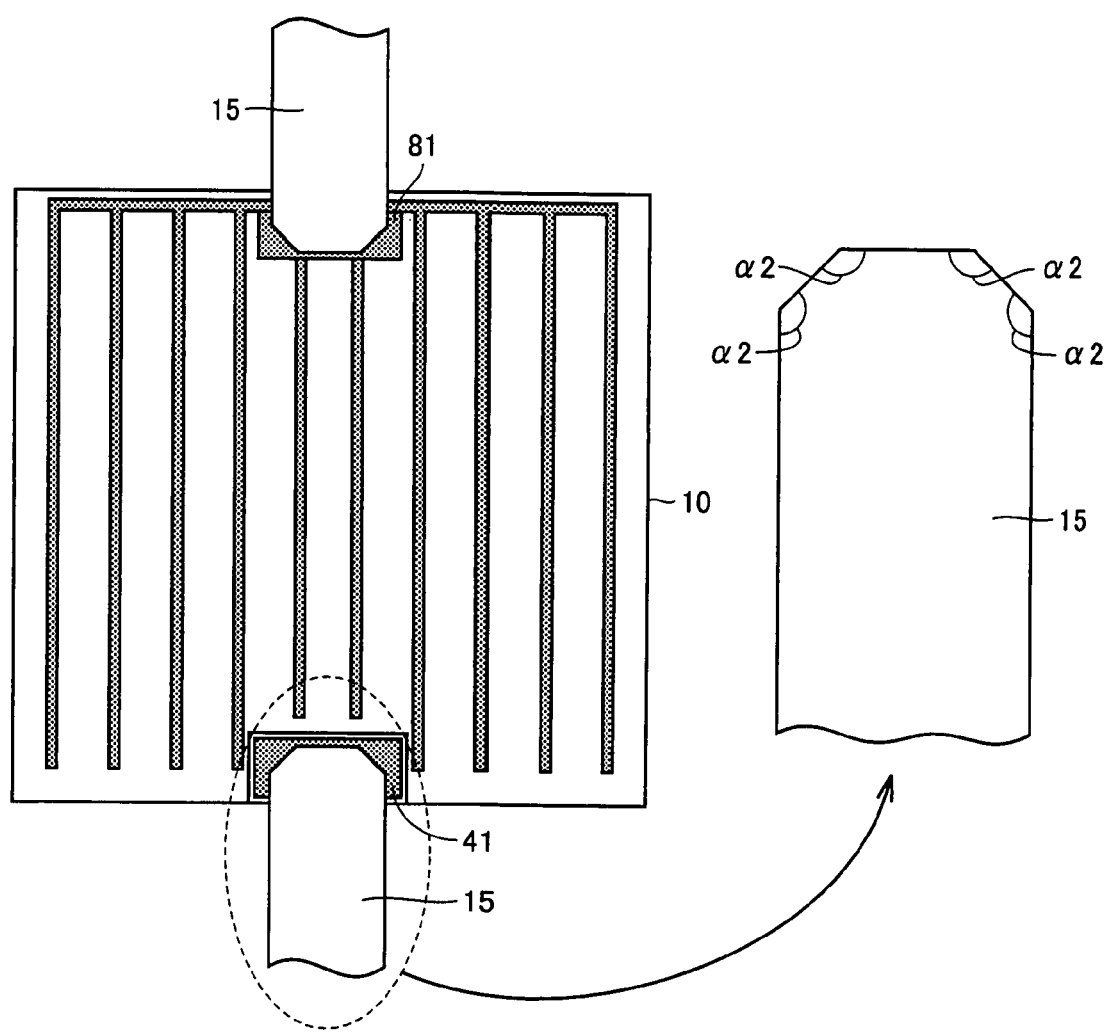
FIG. 6 is a schematic plan view of the interconnector-equipped photoelectric conversion element of the present invention shown in FIG. 5 when seen from above.

FIG. 6 shows a schematic plan view of the interconnector-equipped photoelectric conversion element of the present invention shown in FIG. 5 when seen from above. The interconnector-equipped photoelectric conversion element of the present invention has a characteristic that a leading end portion of each interconnector 15 adjacent to the electrode pad has a surface shape in which any corner has an obtuse angle α2. In this manner, by forming the surface shape of the leading end portion of interconnector 15 adjacent to the electrode pad such that any corner thereof has obtuse angle α2, concentration of stress on the photoelectric conversion layer applied by a corner of interconnector 15 when the photoelectric conversion element is bent can be alleviated compared to the conventional case shown in FIG. 13 using interconnector 5 having a corner of 90°. Accordingly, in the interconnector-equipped photoelectric conversion element of the present invention, damage to the photoelectric conversion layer caused by the corner of interconnector 15 can be reduced, and thus occurrence of cracks in the photoelectric conversion layer can be reduced.

Figure 7:
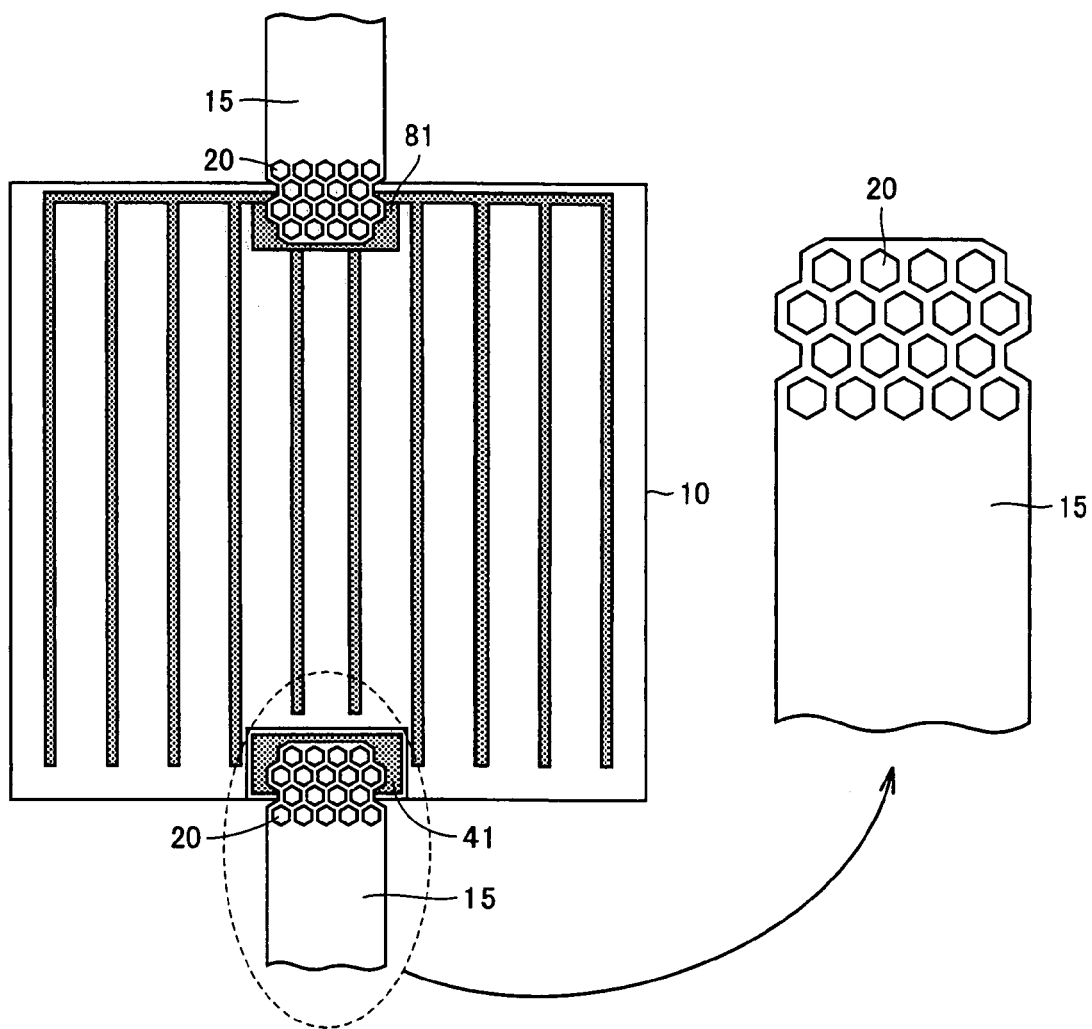
FIG. 7 is a schematic plan view of another preferable exemplary interconnector-equipped photoelectric conversion element of the present invention when seen from above.
Figure 8:
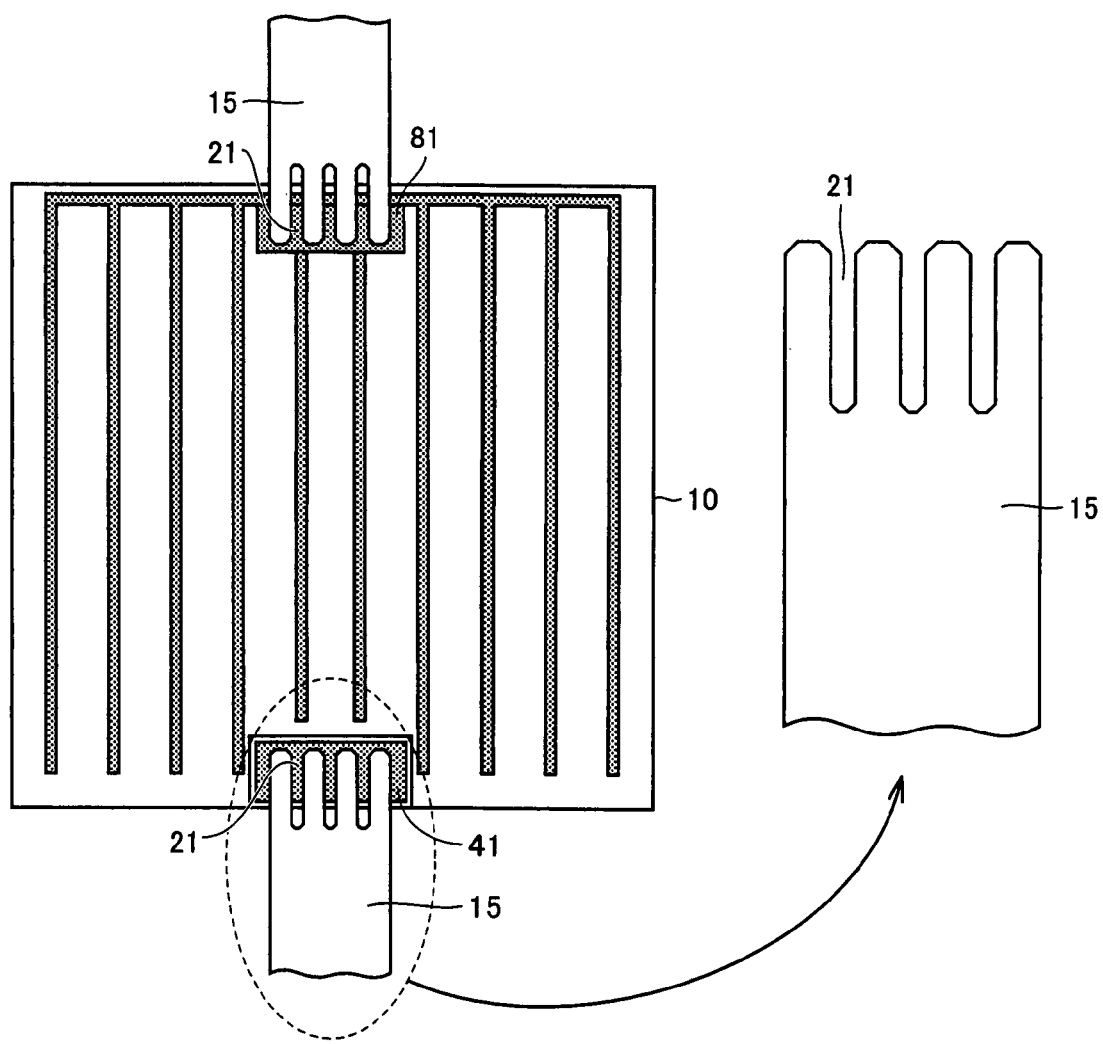
FIG. 8 is a schematic plan view of still another preferable exemplary interconnector-equipped photoelectric conversion element of the present invention when seen from above.

FIG. 7 shows a schematic plan view of another preferable exemplary interconnector-equipped photoelectric conversion element of the present invention when seen from above. Further, FIG. 8 shows a schematic plan view of still another preferable exemplary interconnector-equipped photoelectric conversion element of the present invention when seen from above. In this manner, in the case where interconnector 15 in the interconnector-equipped photoelectric conversion element of the present invention has a surface shape in which any corner has an obtuse angle at its leading end portion adjacent to the electrode pad, the surface shape of the leading end portion of interconnector 15 adjacent to the electrode pad may be provided with a plurality of openings 20 formed like a mesh as shown in FIG. 7, or may be provided with a slit 21 as shown in FIG. 8.

Although the above description has been given on exemplary cases where the interconnector in the interconnector-equipped photoelectric conversion element of the present invention has a surface shape in which any corner has an obtuse angle at its leading end portion adjacent to the electrode pad, the present invention is not limited to these cases, and other shapes may be used.

Further, although the above description has been given on the case where both the interconnector connected to the first electrode pad and the interconnector connected to the second electrode pad have a surface shape in which any corner has an obtuse angle at their respective leading end portions adjacent to the electrode pads, it is satisfactory in the present invention if either the interconnector connected to the first electrode pad or the interconnector connected to the second electrode pad has a surface shape in which any corner has an obtuse angle at its leading end portion adjacent to the electrode pad. From the viewpoint of reducing occurrence of cracks in the photoelectric conversion layer more effectively, however, it is preferable that both the interconnector connected to the first electrode pad and the interconnector connected to the second electrode pad have a surface shape in which any corner has an obtuse angle at their respective leading end portions adjacent to the electrode pads.

Figure 9:
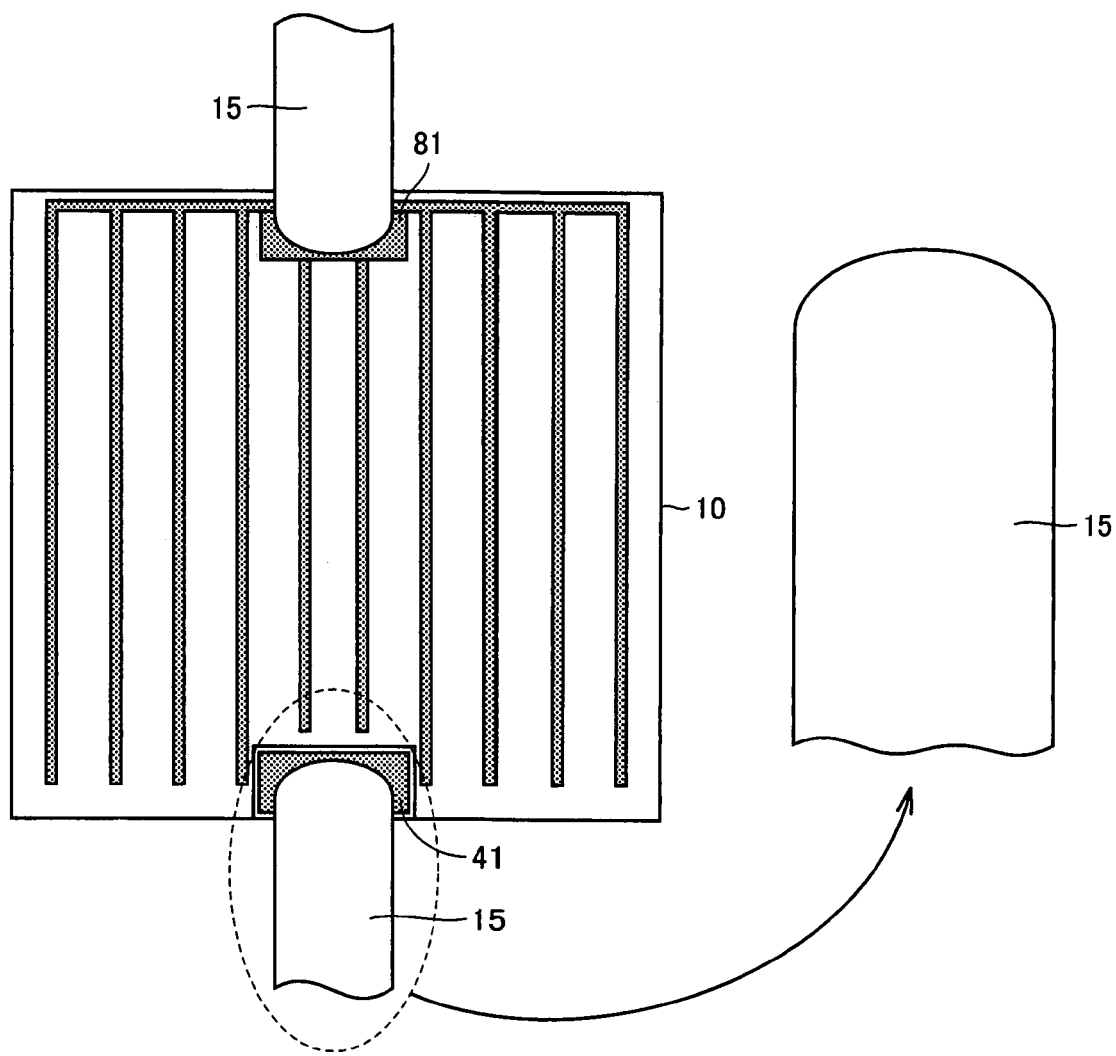
FIG. 9 is a schematic plan view of still another preferable exemplary interconnector-equipped photoelectric conversion element of the present invention when seen from above.

FIG. 9 shows a schematic plan view of still another preferable exemplary interconnector-equipped photoelectric conversion element of the present invention when seen from above. The interconnector-equipped photoelectric conversion element of the present invention has a characteristic that a surface shape of a leading end portion of each interconnector 15 adjacent to the electrode pad is a shape having no corner. In this manner, by forming the surface shape of the leading end portion of interconnector 15 adjacent to the electrode pad as a shape having no corner, concentration of stress on the photoelectric conversion layer that would be applied by a corner of interconnector 15 when the photoelectric conversion element is bent can be alleviated compared to the conventional case shown in FIG. 13 using interconnector 5 having a corner of 90°. Accordingly, in the interconnector-equipped photoelectric conversion element of the present invention, damage to the photoelectric conversion layer that would be caused by the corner of interconnector 15 can be reduced, and thus occurrence of cracks in the photoelectric conversion layer can be reduced.

Figure 10:
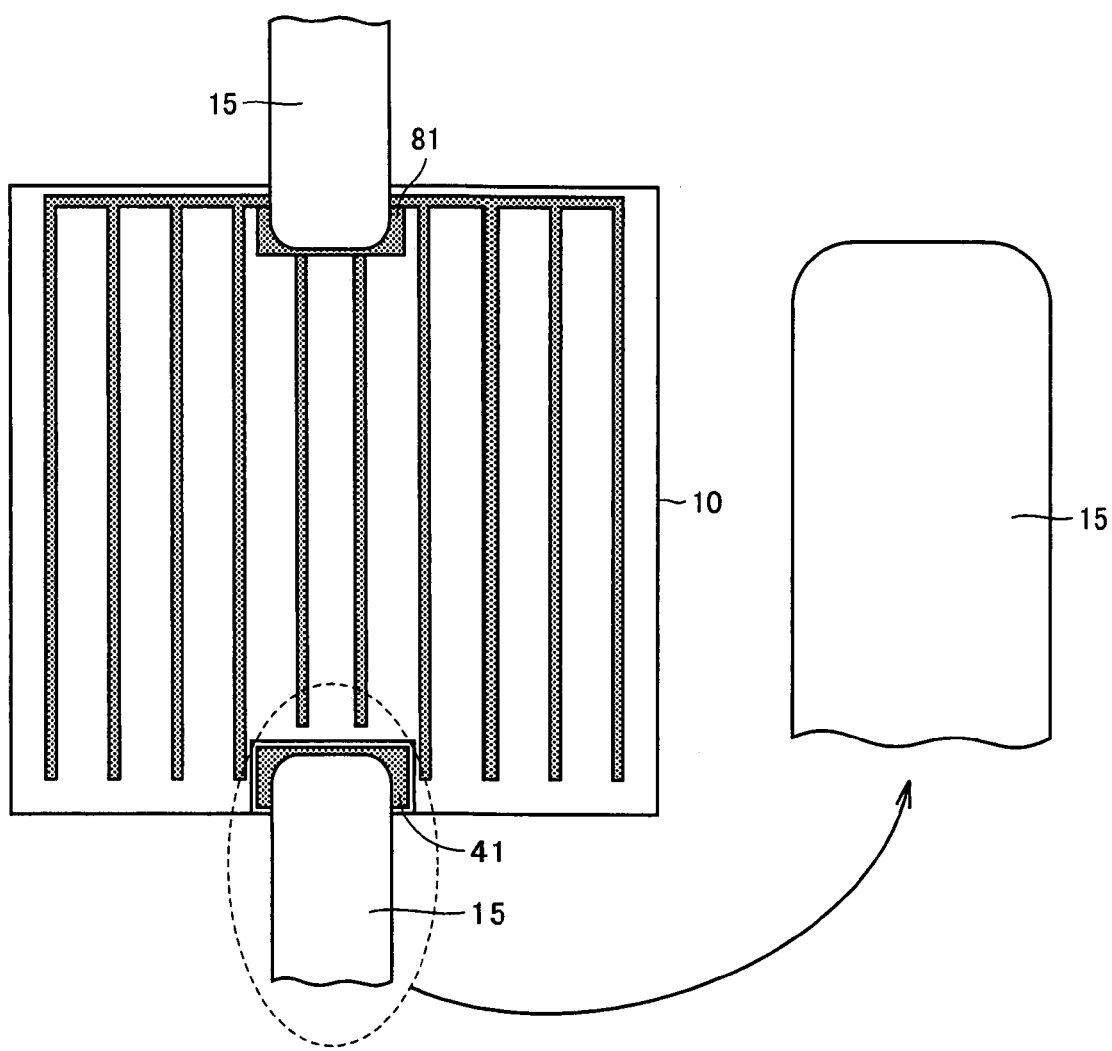
FIG. 10 is a schematic plan view of still another preferable exemplary interconnector-equipped photoelectric conversion element of the present invention when seen from above.

FIG. 10 shows a schematic plan view of still another preferable exemplary interconnector-equipped photoelectric conversion element of the present invention when seen from above. Also in the case where interconnector 15 in the interconnector-equipped photoelectric conversion element of the present invention has a surface shape having no corner at its leading end portion adjacent to the electrode pad as shown in FIG. 10, concentration of stress on the photoelectric conversion layer that would be applied by a corner of interconnector 15 when the photoelectric conversion element is bent can be alleviated compared to the conventional case shown in FIG. 13 using interconnector 5 having a corner of 90°. Accordingly, in the interconnector-equipped photoelectric conversion element of the present invention, damage to the photoelectric conversion layer that would be caused by the corner of interconnector 15 can be reduced, and thus occurrence of cracks in the photoelectric conversion layer can be reduced.

Although the above description has been given on exemplary cases where the interconnector in the interconnector-equipped photoelectric conversion element of the present invention has a surface shape having no corner at its leading end portion adjacent to the electrode pad, the present invention is not limited to these cases, and other shapes may be used.

Further, although the above description has been given on the case where both the interconnector connected to the first electrode pad and the interconnector connected to the second electrode pad have a surface shape having no corner at their respective leading end portions adjacent to the electrode pads, it is satisfactory in the present invention if either the interconnector connected to the first electrode pad or the interconnector connected to the second electrode pad has a surface shape having no corner at its leading end portion adjacent to the electrode pad. From the viewpoint of reducing occurrence of cracks in the photoelectric conversion layer more effectively, however, it is preferable that both the interconnector connected to the first electrode pad and the interconnector connected to the second electrode pad have a surface shape having no corner at their respective leading end portions adjacent to the electrode pads.

Furthermore, in the photoelectric conversion element and the interconnector-equipped photoelectric conversion element of the present invention, photoelectric conversion layer 10 is not particularly limited as long as it is a structure having at least one pn junction. Preferably, photoelectric conversion layer 10 has a thickness of not more than 50 µm. When photoelectric conversion layer 10 has a thickness of not more than 50 µm, the photoelectric conversion element and the interconnector-equipped photoelectric conversion element tend to have good flexibility.

In the photoelectric conversion element and the interconnector-equipped photoelectric conversion element of the present invention, examples of a method for forming the pn junction in photoelectric conversion layer 10 include, but not particularly limited to, vapor-depositing an n-type semiconductor layer on a p-type semiconductor layer, vapor-depositing a p-type semiconductor layer on an n-type semiconductor layer, diffusing an n-type dopant into a surface of a p-type semiconductor layer, and diffusing a p-type dopant into a surface of an n-type semiconductor layer.

Further, in the photoelectric conversion element and the interconnector-equipped photoelectric conversion element of the present invention, materials for the first electrode pad 81, the third electrode 16, the second electrode pad 41, and interconnector 15 are not particularly limited, and any material can be used as long as it has conductivity.

Furthermore, in the photoelectric conversion element and the interconnector-equipped photoelectric conversion element of the present invention, a protective film made of a flexible resin may be affixed to a surface of photoelectric conversion layer 10 with a transparent adhesive, as in the conventional interconnector-equipped photoelectric conversion element described in the section of the background art.

Needless to say, from the viewpoint of reducing occurrence of cracks in the photoelectric conversion layer, it is particularly preferable that an interconnector having a surface shape in which any corner has an obtuse angle or a surface shape having no corner at its leading end portion adjacent to an electrode pad is connected to the electrode pad having a surface shape that is a polygon in which any internal angle is an obtuse angle or a surface shape having no corner, as shown in FIGS. 14 to 17 illustrating schematic plan views.

Figure 14:
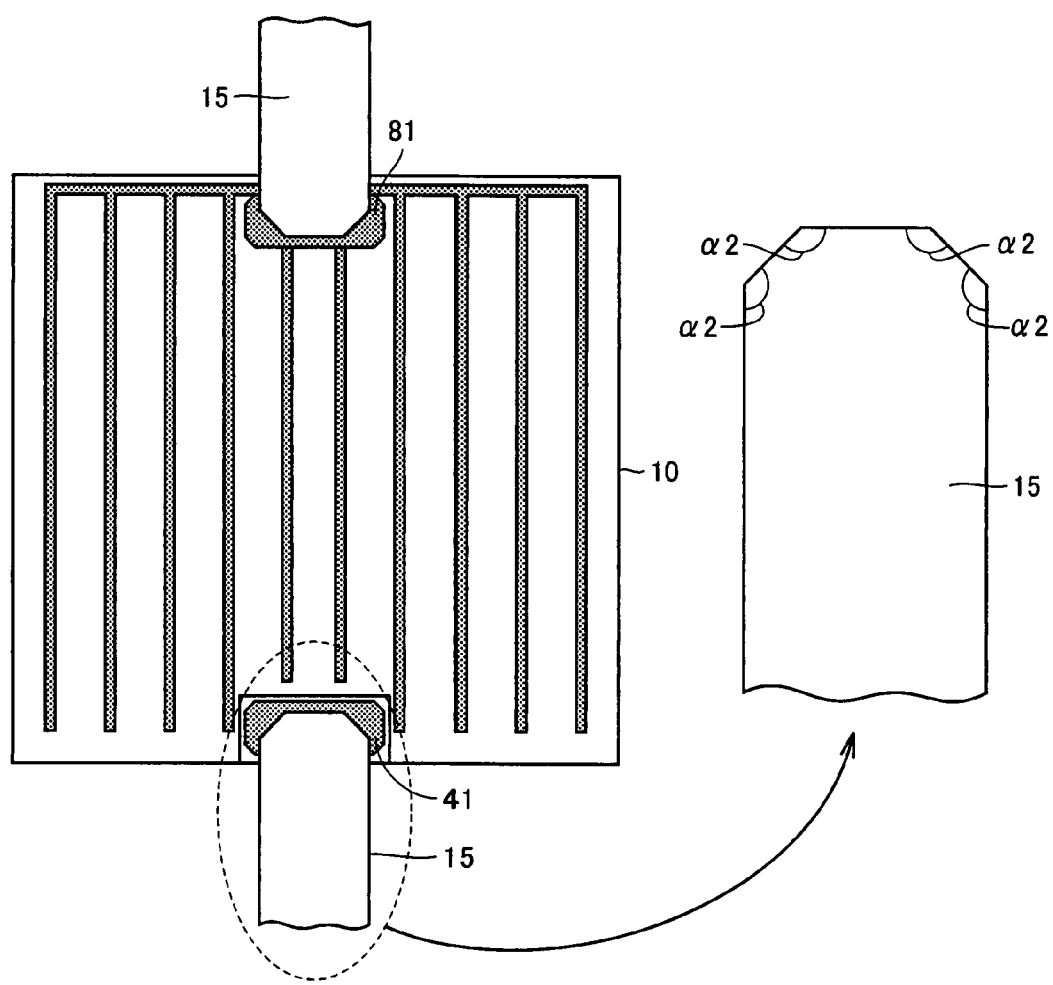
FIG. 14 is a schematic plan view of still another preferable exemplary interconnector-equipped photoelectric conversion element of the present invention when seen from above.

In an interconnector-equipped photoelectric conversion element of the present invention shown in FIG. 14, interconnector 15 shown in FIG. 6 having a surface shape in which any corner has obtuse angle α2 at its leading end portion adjacent to the electrode pad is connected to each of the first electrode pad 81 and the second electrode pad 41 of the photoelectric conversion element shown in FIG. 2. On this occasion, each of the first electrode pad 81 and the second electrode pad 41 of the photoelectric conversion element shown in FIG. 2 has a surface shape that is a polygon in which any internal angle α1 is an obtuse angle, as described above.

Figure 15:
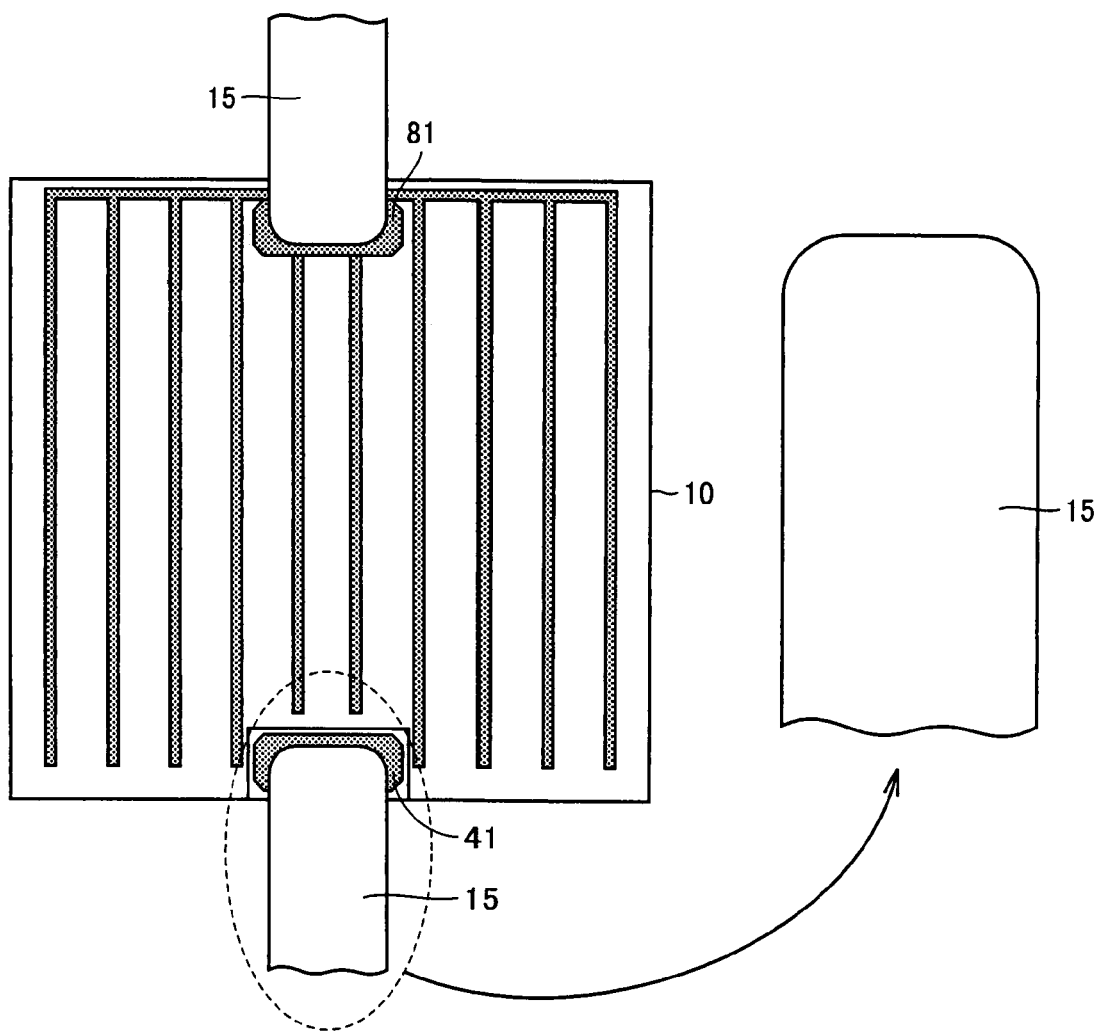
FIG. 15 is a schematic plan view of still another preferable exemplary interconnector-equipped photoelectric conversion element of the present invention when seen from above.

Further, in an interconnector-equipped photoelectric conversion element of the present invention shown in FIG. 15, interconnector 15 shown in FIG. 10 having a surface shape having no corner at its leading end portion adjacent to the electrode pad is connected to each of the first electrode pad 81 and the second electrode pad 41 of the photoelectric conversion element shown in FIG. 2.

Figure 16:
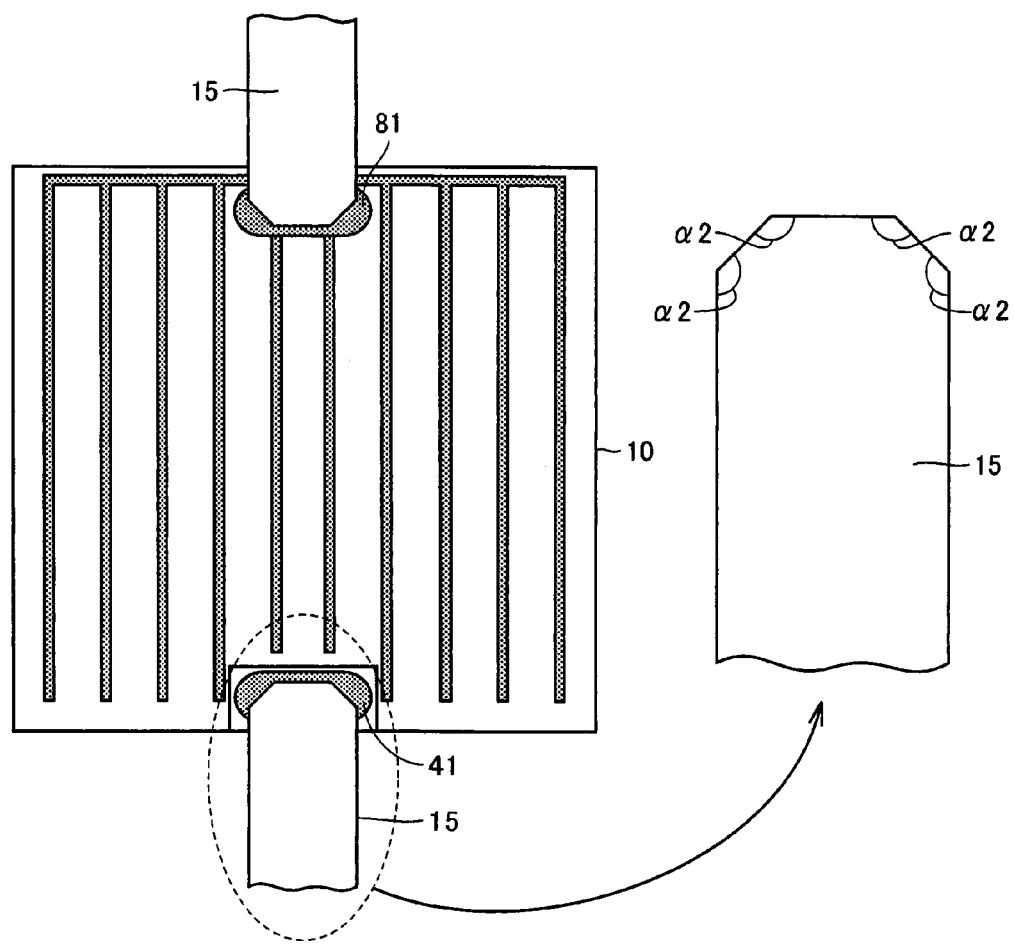
FIG. 16 is a schematic plan view of still another preferable exemplary interconnector-equipped photoelectric conversion element of the present invention when seen from above.

Furthermore, in an interconnector-equipped photoelectric conversion element of the present invention shown in FIG. 16, interconnector 15 shown in FIG. 6 having a surface shape in which any corner has obtuse angle α2 at its leading end portion adjacent to the electrode pad is connected to each of the first electrode pad 81 and the second electrode pad 41 of the photoelectric conversion element shown in FIG. 4. On this occasion, each of the first electrode pad 81 and the second electrode pad 41 of the photoelectric conversion element shown in FIG. 4 has a surface shape like a track having no corner, as described above.

Figure 17:
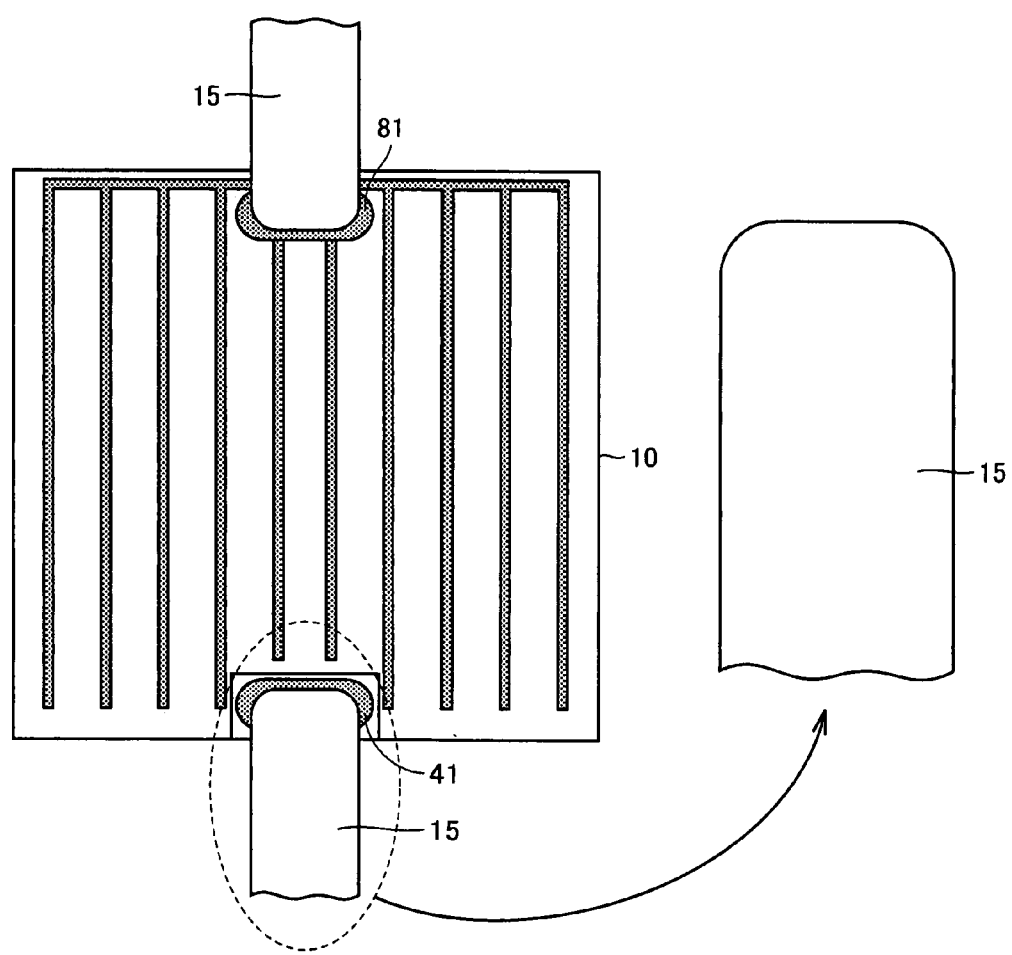
FIG. 17 is a schematic plan view of still another preferable exemplary interconnector-equipped photoelectric conversion element of the present invention when seen from above.

Further, in an interconnector-equipped photoelectric conversion element of the present invention shown in FIG. 17, interconnector 15 shown in FIG. 10 having a surface shape having no corner at its leading end portion adjacent to the electrode pad is connected to each of the first electrode pad 81 and the second electrode pad 41 of the photoelectric conversion element shown in FIG. 4.

It is needless to say that the structure of the interconnector-equipped photoelectric conversion element of the present invention is not limited to those shown in FIGS. 14 to 17. In addition to the structures described above, the interconnector-equipped photoelectric conversion element of the present invention may be formed for example by connecting any of the interconnectors shown in FIGS. 7 to 9 to each of the first electrode pad 81 and the second electrode pad 41 of the photoelectric conversion element shown in FIG. 2, connecting any of the interconnectors shown in FIGS. 6 to 10 to each of the first electrode pad 81 and the second electrode pad 41 of the photoelectric conversion element shown in FIG. 3, and connecting any of the interconnectors shown in FIGS. 7 to 9 to each of the first electrode pad 81 and the second electrode pad 41 of the photoelectric conversion element shown in FIG. 4.

Although the above description has been given on the case where an interconnector is connected to each of the first electrode pad and the second electrode pad, it is satisfactory in the interconnector-equipped photoelectric conversion element of the present invention as long as an interconnector having a surface shape in which any corner has an obtuse angle or a surface shape having no corner at its leading end portion adjacent to the electrode pad is connected to at least one of the first electrode pad and the second electrode pad.

In the present invention, the surface shape of the first electrode pad may be identical to or different from that of the second electrode pad. Further, in the present invention, the surface shape of the interconnector to be connected to the first electrode pad at its leading end portion adjacent to the electrode pad may be identical to or different from that of the interconnector to be connected to the second electrode pad at its leading end portion adjacent to the electrode pad.

EXAMPLE

Firstly, an n-type GaAs layer was formed on a p-type Ge substrate doped with Ga. On that occasion, As in the n-type GaAs layer was diffused into the p-type Ge substrate, and thus an n-type Ge layer was formed on a surface of the p-type Ge substrate. Next, an n-type InGaP layer, a p-type AlGaAs layer, a p-type InGaP layer, a p-type GaAs layer, an n-type GaAs layer, an n-type AlInP layer, an n-type InGaP layer, a p-type AlGaAs layer, a p-type AlInP layer, a p-type InGaP layer, an n-type InGaP layer, an n-type AlInP layer, and an n-type GaAs layer were epitaxially grown in this order on the n-type GaAs layer, and thus a photoelectric conversion layer having at least one pn junction was formed on the p-type Ge substrate. The photoelectric conversion layer had an overall thickness of 4 µm.

Then, an Au—Ge film, a Ni film, an Au film, and an Ag film were deposited in this order on a surface of the n-type GaAs layer, which was the uppermost surface of the photoelectric conversion layer, and thermal treatment was performed to form the first electrode pad in the shape of a rectangle having a width of 2.7 mm and a length of 0.85 mm and a comb-like collector electrode connected to the first electrode pad.

Next, a portion of the photoelectric conversion layer was removed with acid and alkaline etchants, an Au film and an Ag film were deposited in this order on an exposed surface of the photoelectric conversion layer (a surface different from a surface on which the first electrode pad was formed, but facing the same side as the surface on which the first electrode pad was formed). Then, thermal treatment was performed to form the second electrode pad.

Thereafter, the p-type Ge substrate was separated from the photoelectric conversion layer, and then the third electrode made of a metal thin film was formed on a surface of the photoelectric conversion layer opposite to the surface on which the second electrode pad was formed. Subsequently, the photoelectric conversion layer was cut into a rectangular plate having a width of 20 mm and a length of 20 mm to obtain a photoelectric conversion element. A plurality of photoelectric conversion elements were fabricated in the same manner as described above.

Figure 11:
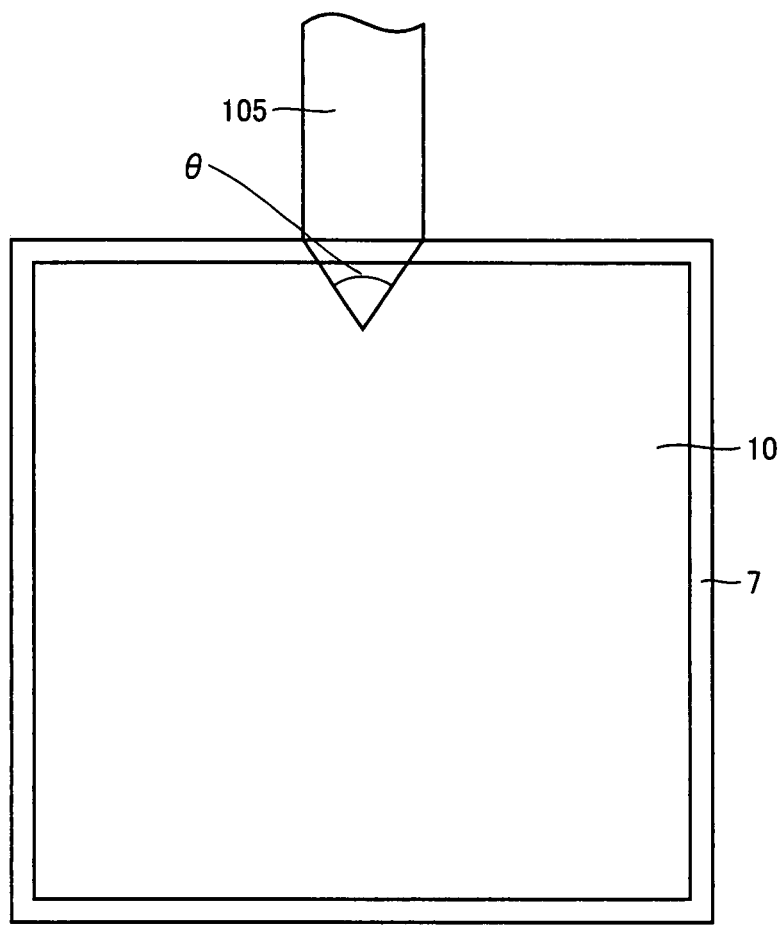
FIG. 11 is a schematic plan view of an interconnector-equipped photoelectric conversion element of the present invention in an example after a protective film is affixed thereto.
Figure 12:
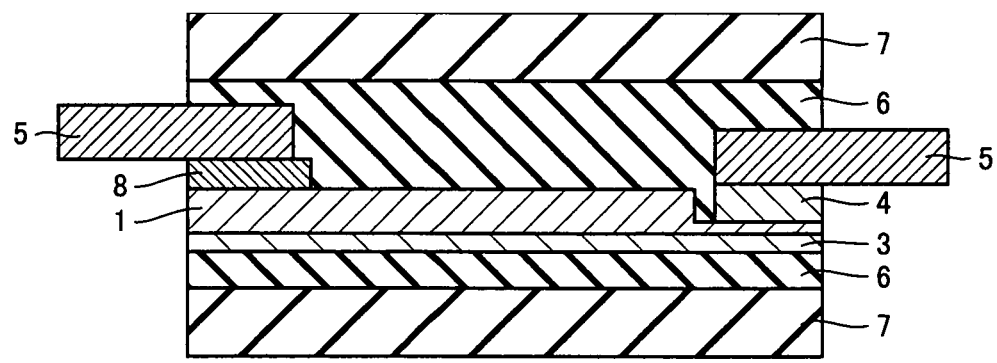
FIG. 12 is a schematic cross sectional view of an exemplary conventional interconnector-equipped photoelectric conversion element.

To the first electrode pad of each of the photoelectric conversion elements fabricated as described above, an interconnector 105 having a leading end portion adjacent to the electrode pad with an angle θ of 90°, 105°, 120°, or 135° was connected as shown in FIG. 11 illustrating a schematic plan view, and then a 100 µm-thick polyethylene terephthalate film serving as protective film 7 was affixed using a transparent adhesive to both main surfaces of each photoelectric conversion element having interconnector 105 connected thereto, to fabricate an interconnector-equipped photoelectric conversion element. FIG. 11 shows a schematic plan view of the interconnector-equipped photoelectric conversion element having the protective film affixed thereto. Interconnector 105 was made of an Ag alloy containing Ca, and had a thickness of 30 µm.

Subsequently, each of the interconnector-equipped photoelectric conversion elements fabricated as described above was bent at various curvatures and bending angles to evaluate whether cracks were caused in the photoelectric conversion layer in each of the interconnector-equipped photoelectric conversion elements. As a result, many cracks were caused when the leading end portion of the interconnector adjacent to the electrode pad had angle θ of 90°, whereas less cracks were caused when angle θ was 105° compared to the case where angle θ was 90°. Further, when the leading end portion of the interconnector adjacent to the electrode pad had angle θ of not less than 120°, no crack was caused in the photoelectric conversion layer in the interconnector-equipped photoelectric conversion element.

Consequently, it has been confirmed that occurrence of cracks in the photoelectric conversion layer in the interconnector-equipped photoelectric conversion element can be reduced when the leading end portion of the interconnector adjacent to the electrode pad has a surface shape in which a corner has an obtuse angle, and that occurrence of cracks in the photoelectric conversion layer in the interconnector-equipped photoelectric conversion element can significantly be reduced particularly when the abtuse angle is not less than 120°.

The photoelectric conversion element of the present invention can suitably be utilized for a solar cell produced using a compound semiconductor thin film. Further, the interconnector-equipped photoelectric conversion element of the present invention can suitably be utilized for an interconnector-equipped solar cell produced using a compound semiconductor thin film.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An interconnector-equipped photoelectric conversion element, comprising:
   a photoelectric conversion element including
      a photoelectric conversion layer having at least one pn junction,
      a first electrode pad provided on and in contact with a surface of said photoelectric conversion layer,
      a second electrode pad provided on and in contact with a surface of said photoelectric conversion layer different from said surface of said photoelectric conversion layer on which said first electrode pad is provided, said surface on which said second electrode pad is provided facing the same side as said surface on which said first electrode pad is provided, and
      a third electrode provided on and in contact with a surface of said photoelectric conversion layer opposite to the surface on which said second electrode pad is provided; and
   an interconnector connected to at least one of said first electrode pad and said second electrode pad of said photoelectric conversion element,
   wherein a leading end portion of said interconnector adjacent to said electrode pad has a surface shape having one or more corners in which each corner has an obtuse angle or said leading end portion of said interconnector has a surface shape having no corner.

2. The interconnector-equipped photoelectric conversion element according to claim 1, wherein when said surface shape has one or more corners, said obtuse angle of each corner is not less than 120°.

3. The interconnector-equipped photoelectric conversion element according to claim 1, wherein said photoelectric conversion layer of said photoelectric conversion element has a thickness of not more than 50 μm.

4. The interconnector-equipped photoelectric conversion element according to claim 1, comprising:
   a first interconnector connected to said first electrode pad; and
   a second interconnector connected to said second electrode pad,
   wherein said leading end portion of said first interconnector adjacent to said first electrode pad has a surface shape having one or more corners in which each corner has an obtuse angle or said leading end portion of said first inter connector has a surface shape having no corner, and
   wherein said leading end portion of said second interconnector adjacent to said second electrode pad has a surface shape having one or more corners in which each corner has an obtuse angle or said leading end portion of said second interconnector has a surface shape having no corner.

5. The interconnector-equipped photoelectric conversion element according to claim 1, wherein said first and second electrode pads do not have an opening.

6. The interconnector-equipped photoelectric conversion element according to claim 1, wherein the surfaces of said photoelectric conversion layer contacting said first and second electrode pads are on a same side opposite to the surface contacting said third electrode.

7. The interconnector-equipped photoelectric conversion element according to claim 1, wherein said interconnector is provided with a plurality of openings formed in a mesh at said leading end portion.

8. The interconnector-equipped photoelectric conversion element according to claim 1, wherein said interconnector is provided with a plurality of slits at said leading end portion.

9. The interconnector-equipped photoelectric conversion element according to claim 1, wherein at least one of said first electrode pad and said second electrode pad have a surface shape of ellipse.

10. The interconnector-equipped photoelectric conversion element according to claim 1, wherein at least one of said first electrode pad and said second electrode pad have a surface shape of a track.

11. The interconnector-equipped photoelectric conversion element according to claim 1, wherein said interconnector is made of an Ag alloy containing Ca.

* * * * *